US008510086B1

(12) United States Patent  (10) Patent No.: US 8,510,086 B1
Winkler et al.  (45) Date of Patent: Aug. 13, 2013

(54) AIRCRAFT PASSENGER FLOW SYSTEM

(75) Inventors: Edward Richard Winkler, St. Peters, MO (US); Jonathan French, Winter Springs, FL (US); Gregory Earl Mattocks, Bothell, WA (US); Jacki Jo Konesky, Spokane, WA (US)

(73) Assignee: The Boeing Company, Chicago, IL (US)

( * ) Notice: Subject to any disclaimer, the term of this patent is extended or adjusted under 35 U.S.C. 154(b) by 739 days.

(21) Appl. No.: 12/695,505

(22) Filed: Jan. 28, 2010

(51) Int. Cl.
*G06G 7/48* (2006.01)
*G06F 17/50* (2006.01)

(52) U.S. Cl.
CPC ................................. *G06F 17/5009* (2013.01)
USPC ...................................... 703/6; 703/7; 703/8

(58) Field of Classification Search
USPC .......................................................... 703/6–8
See application file for complete search history.

(56) References Cited

U.S. PATENT DOCUMENTS

2005/0055180 A1* 3/2005 Pischke et al. ..................... 703/1
2009/0109223 A1* 4/2009 Schalla et al. .................. 345/427
2012/0018582 A1* 1/2012 Wallace ......................... 244/137.2

OTHER PUBLICATIONS

Landeghem et al. "Reducing passenger boarding time in airplanes: A simulation based approach". European Journal of Operational Research 142 (2002). p. 294-308.*
Team 2053., "Boarding at the Speed of Flight".,http://www.math.duke.edu/news/awards/mcm2007bbe.pdf., 2007. pp. 30.*
Marelli et al. "The Role of Computer Simulation in Reducing Airplane Turn Time",pp. 1-8, http://www.boein.com/commercial/aeromagazine/aero_01/textonly/t01txt.html, 1998. Boeing Aero Magazine (1).
Livermore, "A multi-agent system approach to a simulation study comparing the performance of aircraft boarding using pre-assigned seating and free-for-all strategies", Open University submission, Mar. 2009, pp. 1-155.
Steffen, "Optimal boarding method for airline passengers", Feb. 2008, Elsevier, pp. 1-15.
Bachmat et al., "Analysis of aeroplane boarding via spacetime geometry and random matrix theory", Journal of Physics A: Mathematical and General, 39 (2006) L453-L459.
Bachmat et al., "Analysis of Airplane Boarding Times", Operations Research, vol. 57, No. 2, Mar.-Apr. 2009, pp. 499-513.
Bazargan, "A linear programming approach for aircraft boarding strategy", Dec. 2006, Elsevier www.sciencedirect.com, 18 Pages.
Nyquist et al., "A study of the airline boarding problem", Journal of Air Transport Management 14 (2008), pp. 197-204.

* cited by examiner

*Primary Examiner* — Eunhee Kim
(74) *Attorney, Agent, or Firm* — Yee & Associates, P.C.

(57) ABSTRACT

A method and apparatus for analyzing passenger flow. A three-dimensional model of a passenger cabin is received. Features in the three-dimensional model of the passenger cabin are identified in response to receiving the three-dimensional model. A first plurality of objects is generated for the features in the passenger cabin. User input identifying a number of characteristics for passengers is received. A second plurality of objects for the passengers is generated using the number of characteristics. The second plurality of objects is assigned to seats within the passenger cabin. Each of the second plurality of objects is assigned a destination location and has a behavior when encountering an obstacle while moving from a current location to the destination location. A movement of the passengers to a number of locations relative to the seats assigned to the passengers is simulated using the second plurality of objects.

24 Claims, 12 Drawing Sheets

AIRCRAFT PASSENGER FLOW SYSTEM

BACKGROUND INFORMATION

1. Field

The present disclosure relates generally to the movement of passengers and, in particular, to modeling the movement of passengers for an aircraft. Still more particularly, the present disclosure relates to a method and apparatus for modeling the movement of passengers during enplaning and deplaning of an aircraft.

2. Background

Aircraft utilization is one performance indicator used by airlines. The amount of aircraft utilization plays a role in the profitability of airlines. Increasing aircraft utilization may result in increased revenues and/or profitability for an airline. The amount of aircraft utilization is affected by different factors. For example, increasing aircraft utilization includes coordinating various components for an airline. These components include, for example, fleet planning, schedule planning, passenger reservations, flight operations, ground operations, aircraft maintenance, and/or other suitable components.

Turnaround time is the time between an aircraft arriving at a gate and leaving the gate. Reducing the turnaround time results in an increase in the efficiency of aircraft utilization. This increase in efficiency may increase the number of flights that can be performed in a day by the airline. Additionally, reducing the turnaround time also may reduce the cost of seats per mile per flight.

A number of different operations occur during the period of turnaround time. For example, the enplaning and deplaning of passengers occurs during this time period. Additionally, cleaning, inspection, and maintenance also may be performed during the period of turnaround time.

Enplaning involves the movement of passengers to their seats in the aircraft. Deplaning involves the movement of passengers from their seats out of the aircraft.

As fuel prices increase and competition increases, even small reductions in the turnaround time may increase the competitiveness of an airline and/or increase profits for an airline.

The typical turnaround time for an aircraft is from about 30 minutes to about 60 minutes. A large portion of this time is the time needed for passengers to enplane and/or deplane the aircraft.

Many different strategies are present for reducing the time needed for passenger enplaning and deplaning. For example, with passenger enplaning, typical strategies include calling for passengers to enplane from the back rows of seats to the front rows of seats in groups. Other strategies include calling passengers in groups based on window to aisle seating. Still other strategies for enplaning an aircraft include boarding by groups based on when boarding passes are obtained.

Therefore, it would be advantageous to have a method and apparatus that takes into account one or more of the issues discussed above, as well as possibly other issues.

SUMMARY

In one advantageous embodiment, a method is present for analyzing passenger flow. A three-dimensional model of a passenger cabin is received. A plurality of features in the three-dimensional model of the passenger cabin is identified in response to receiving the three-dimensional model of the passenger cabin. A first plurality of objects is generated for the plurality of features in the passenger cabin. User input identifying a number of characteristics for a plurality of passengers is received. A second plurality of objects for the plurality of passengers is generated using the number of characteristics. The second plurality of objects is assigned to a plurality of seats within the passenger cabin. Each of the second plurality of objects is assigned a destination location and has a behavior when encountering an obstacle while moving from a current location to the destination location. A movement of the plurality of passengers to a number of locations relative to the plurality of seats assigned to the plurality of passengers is simulated using the second plurality of objects.

In another advantageous embodiment, an apparatus comprises a bus system, a memory connected to the bus system, and a processor unit connected to the bus system. The processor unit is configured to run a program to receive a three-dimensional model of a passenger cabin; identify a plurality of features in the three-dimensional model of the passenger cabin in response to receiving the three-dimensional model of the passenger cabin; generate a first plurality of objects for the plurality of features in the passenger cabin; receive user input identifying a number of characteristics for a plurality of passengers; generate a second plurality of objects for the plurality of passengers using the number of characteristics; and simulate a movement of the plurality of passengers to a number of locations relative to the plurality of seats assigned to the plurality of passengers using the second plurality of objects. The second plurality of objects is assigned to a plurality of seats within the passenger cabin. Each of the second plurality of objects is assigned a destination location and has a behavior when encountering an obstacle while moving from a current location to the destination location.

The features, functions, and advantages can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the advantageous embodiments are set forth in the appended claims. The advantageous embodiments, however, as well as a preferred mode of use, further objectives, and advantages thereof, will best be understood by reference to the following detailed description of an advantageous embodiment of the present disclosure when read in conjunction with the accompanying drawings, wherein:

DETAILED DESCRIPTION

Figure 1:
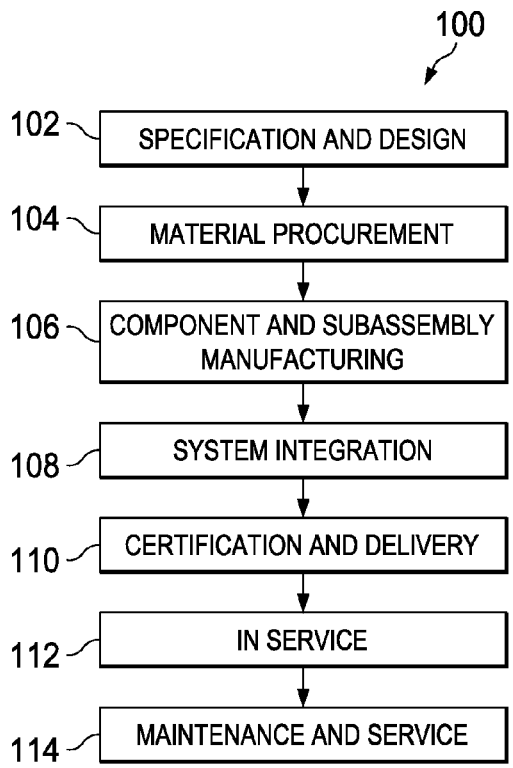
FIG. 1 is an illustration of an aircraft manufacturing and service method in accordance with an advantageous embodiment.
Figure 2:
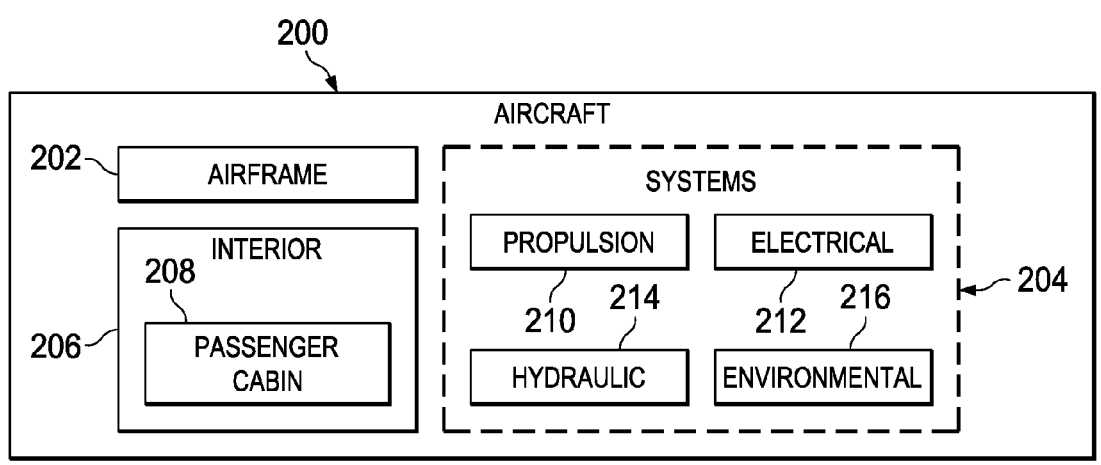
FIG. 2 is an illustration of an aircraft in which an advantageous embodiment may be implemented.

Referring more particularly to the drawings, embodiments of the disclosure may be described in the context of aircraft manufacturing and service method 100 as shown in FIG. 1 and aircraft 200 as shown in FIG. 2. Turning first to FIG. 1, an illustration of an aircraft manufacturing and service method is depicted in accordance with an advantageous embodiment. During pre-production, aircraft manufacturing and service method 100 may include specification and design 102 of aircraft 200 in FIG. 2 and material procurement 104.

During production, component and subassembly manufacturing 106 and system integration 108 of aircraft 200 in FIG. 2 takes place. Thereafter, aircraft 200 in FIG. 2 may go through certification and delivery 110 in order to be placed in service 112. While in service 112 by a customer, aircraft 200 in FIG. 2 is scheduled for routine maintenance and service 114, which may include modification, reconfiguration, refurbishment, and other maintenance or service.

Each of the processes of aircraft manufacturing and service method 100 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of venders, subcontractors, and suppliers; and an operator may be an airline, leasing company, military entity, service organization, and so on.

With reference now to FIG. 2, an illustration of an aircraft is depicted in which an advantageous embodiment may be implemented. In this example, aircraft 200 is produced by aircraft manufacturing and service method 100 in FIG. 1 and may include airframe 202 with a plurality of systems 204 and interior 206. Examples of systems 204 include one or more of propulsion system 210, electrical system 212, hydraulic system 214, and environmental system 216. Any number of other systems may be included. Although an aerospace example is shown, different advantageous embodiments may be applied to other industries, such as the automotive industry.

In this illustrative example, interior 206 includes passenger cabin 208. Passenger cabin 208 is the area in which passengers may be seated or congregate. Passenger cabin 208 may include different types of passenger sections in the aircraft. For example, passenger cabin 208 may include first class, business class, economy class, and/or other types of classes. Additionally, passenger cabin 208 may include two or more levels of passenger seating areas. Additionally, passenger cabin 208 also may include lounges and other areas in which passengers may congregate within aircraft 200.

Apparatus and methods embodied herein may be employed during at least one of the stages of aircraft manufacturing and service method 100 in FIG. 1. As used herein, the phrase "at least one of", when used with a list of items, means that different combinations of one or more of the listed items may be used and only one of each item in the list may be needed. For example, "at least one of item A, item B, and item C" may include, for example, without limitation, item A or item A and item B. This example also may include item A, item B, and item C or item B and item C.

As yet another example, a number of apparatus embodiments, method embodiments, or a combination thereof may be utilized during production stages, such as component and subassembly manufacturing 106 and system integration 108 in FIG. 1. A number, when referring to items, means one or more items. For example, a number of apparatus embodiments are one or more apparatus embodiments. A number of apparatus embodiments, method embodiments, or a combination thereof may be utilized during specification and design 102 of aircraft 200. Other advantageous embodiments may be employed while aircraft 200 is in service 112 and/or during maintenance and service 114 in FIG. 1.

The use of a number of the different advantageous embodiments may substantially expedite the assembly of and/or reduce the cost of aircraft 200. More specifically, one or more different advantageous embodiments may be used to design passenger cabins, walkways, passenger areas, or other suitable locations in which passengers move during enplaning and deplaning. Additionally, different advantageous embodiments may be used to change or modify existing configurations or processes for enplaning and deplaning.

The different advantageous embodiments recognize and take into account a number of different considerations. For example, the different advantageous embodiments recognize and take into account that testing the enplaning and/or deplaning of a new aircraft may involve using the actual aircraft and live passengers to identify times needed to enplane and/or deplane passengers. These types of tests are useful but may be more time consuming and expensive than desired. For example, when testing the enplaning and deplaning procedures for an actual aircraft, the aircraft is unavailable for use. Further, if the configuration of seats is changed within the aircraft, time and expense is needed to make these changes for the tests.

The different advantageous embodiments recognize and take into account that currently available models and processes for simulating passenger flow are focused on the processes used to enplane or deplane an aircraft.

Thus, the different advantageous embodiments provide a method and apparatus for analyzing passenger flow. In one or more advantageous embodiments, a passenger flow system is provided to identify the movement of a plurality of passengers and the time needed for that movement. A three-dimensional model of a passenger cabin is received. A plurality of features in the three-dimensional model of a passenger cabin is identified in response to receiving the three-dimensional model. The process then generates a first plurality of objects for the plurality of features identified in the passenger cabin. User input is also received identifying a number of characteristics for the plurality of passengers. A second plurality of objects is generated for the plurality of passengers using the number of characteristics.

The second plurality of objects is assigned to a plurality of seats within the passenger cabin. Each of the second plurality of objects is assigned a destination location and has a behavior when encountering an obstacle while moving from a current location to a destination location. The movement of the plurality of passengers is simulated. This movement is to a number of locations relative to the plurality of seats assigned to the plurality of passengers. This movement of the plurality of passengers is simulated using the second plurality of objects in these illustrative examples.

Figure 3:
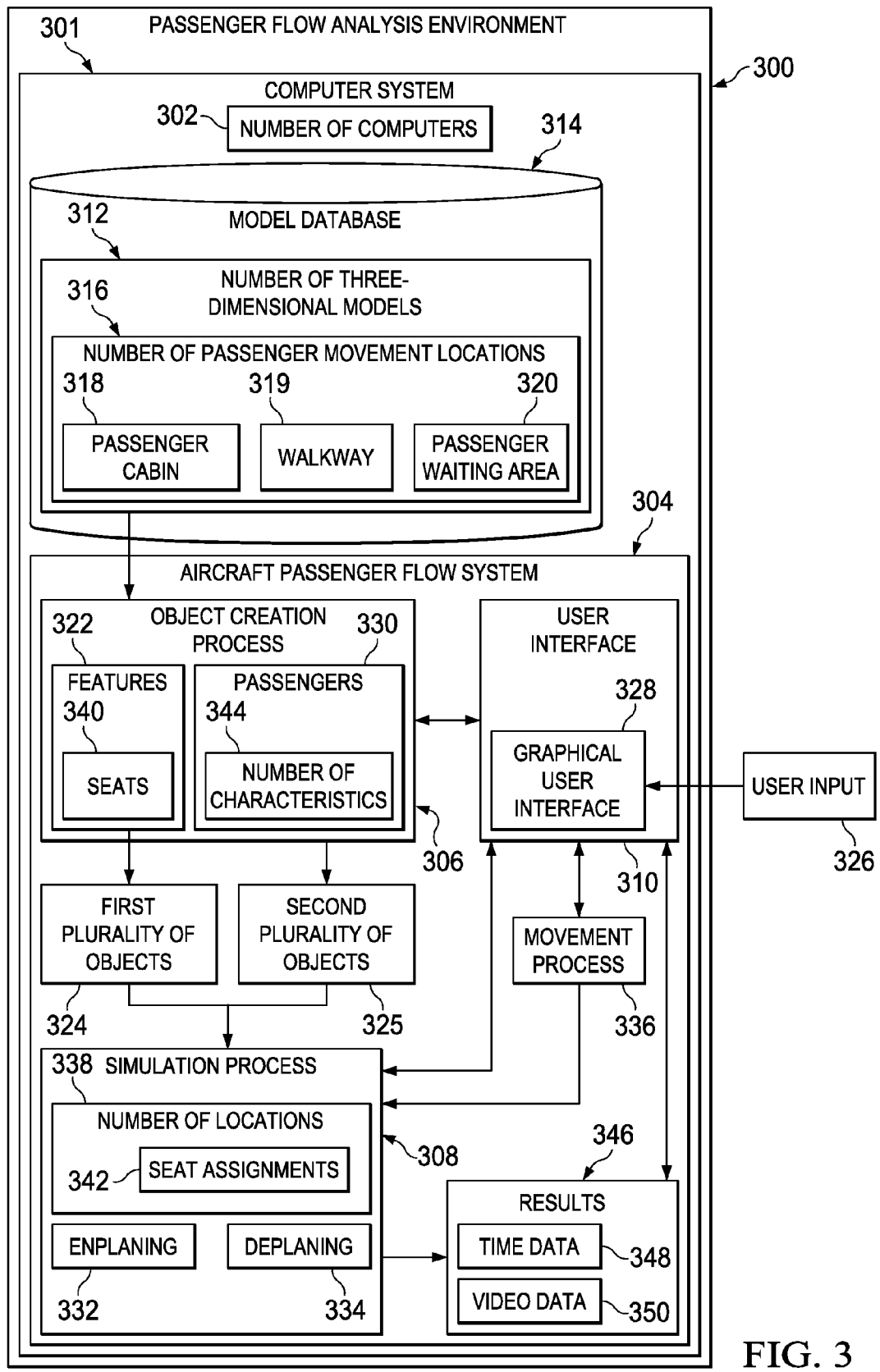
FIG. 3 is an illustration of a passenger flow analysis environment in accordance with an advantageous embodiment.

With reference now to FIG. 3, an illustration of a passenger flow analysis environment is depicted in accordance with an advantageous embodiment. Passenger flow analysis environment 300 may be used to analyze passenger flow within passenger cabin 208 of aircraft 200 in FIG. 2.

In this illustrative example, passenger flow analysis environment 300 includes computer system 301. Computer system 301 comprises number of computers 302. When more than one computer is present in number of computers 302, number of computers 302 may communicate with each other using a network or some other type of communications fabric.

Aircraft passenger flow system 304 is software that runs on computer system 301. Aircraft passenger flow system 304 is used to identify the movement of passengers to seats in a passenger cabin and the time needed for this movement. In this illustrative example, aircraft passenger flow system 304 includes object creation process 306, simulation process 308, and user interface 310. In these illustrative examples, object creation process 306 in aircraft passenger flow system 304 receives number of three-dimensional models 312 from model database 314. Model database 314 may be located within computer system 301 or in some other storage device or computer system.

In these illustrative examples, number of three-dimensional models 312 may be, for example, without limitation, computer aided design models. Number of three-dimensional models 312 includes models of number of passenger movement locations 316. A passenger movement location within number of passenger movement locations 316 is a location in which a passenger may move during at least one of enplaning and deplaning an aircraft.

For example, number of passenger movement locations 316 may include at least one of passenger cabin 318, walkway 319, and passenger waiting area 320. Passenger cabin 318 may be, for example, passenger cabin 208 in FIG. 2. Walkway 319 may be a walkway in which passengers may move to reach passenger cabin 318. For example, walkway 319 may be a walkway from the gate of an airport terminal to the door of an aircraft. Passenger waiting area 320 may be a location where passengers wait before traveling through walkway 319 to passenger cabin 318. For example, passenger waiting area 320 may be a passenger seating area at an airport terminal.

When object creation process 306 receives number of three-dimensional models 312, object creation process 306 identifies features 322. Features 322 may include, for example, without limitation, a seat, a bin, a closet, an aisle, a lavatory, a structure, a door, or other suitable types of features. Using features 322, object creation process 306 generates first plurality of objects 324.

Additionally, object creation process 306 also receives user input 326 through user interface 310. In these illustrative examples, user interface 310 takes the form of graphical user interface 328. User input 326, in these examples, is used to identify number of characteristics 344 for passengers 330. Number of characteristics 344 is used by object creation process 306 to generate second plurality of objects 325 for passengers 330. In other words, each object within second plurality of objects 325 is a representation of a passenger within passengers 330.

Simulation process 308 simulates at least one of enplaning 332 and deplaning 334 for passengers 330. The simulation is performed using first plurality of objects 324, second plurality of objects 325, and movement process 336. Movement process 336 is a process used to move passengers 330 to number of locations 338 relative to seats 340. In other words, movement process 336 is a plan used to move passengers to number of locations 338 relative to seats 340. In some illustrative embodiments, this plan may be a plan specific to a particular airline, a particular industry, and/or a particular situation. In these examples, seats 340 may be features identified within features 322 and represented in first plurality of objects 324.

Movement process 336 may move particular passengers in passengers 330 in a particular order to number of locations 338. Of course, in some illustrative examples, movement process 336 may move passengers 330 in a random order with random sized groups or no groups at all. Number of locations 338 may vary, depending on whether enplaning 332 or deplaning 334 occurs. Further, movement process 336 may move passengers 330 based on input received through user interface 310.

For example, when enplaning 332 occurs, number of locations 338 may be seat assignments 342 assigned to passengers 330 in seats 340. If deplaning 334 occurs, number of locations 338 may be a doorway, an aisle, a walkway, a passenger waiting area, or some other location.

Simulation process 308 runs simulation 343 to generate results 346. In these illustrative examples, results 346 include at least one of time data 348, video data 350, and/or other suitable information. Time data 348 may include the overall time needed for enplaning 332 and/or deplaning 334. Video data 350 may provide a view of the movement of passengers 330 during enplaning 332 and/or deplaning 334.

With results 346, changes to movement process 336 may be made to identify what improvements may be made to time data 348. Additionally, changes to passenger cabin 318, walkway 319, and/or passenger waiting area 320 may be made to determine whether improvements in time data 348 occur.

When time data 348 meets desired times or requirements, movement process 336 may be used in the actual enplaning and deplaning of passengers in a passenger cabin modeled by passenger cabin 318. Further, changes to the three-dimensional models also may be implemented, depending on results 346. In some cases, the three-dimensional model may meet the desired time for enplaning 332 and/or deplaning 334 without changes.

The illustration of passenger flow analysis environment 300 in FIG. 3 is not meant to imply physical or architectural limitations in the manner in which different advantageous embodiments may be implemented. Other components in addition to and/or in place of the ones illustrated may be used. Some components may be unnecessary in some advantageous embodiments. Also, the blocks are presented to illustrate some functional components. One or more of these blocks may be combined and/or divided into different blocks when implemented in different advantageous embodiments.

For example, in some advantageous embodiments, passenger cabin 318 may be for a platform other than an aircraft. For example, passenger cabin 318 may be a three-dimensional model of a bus, a ferry, an auditorium, or some other suitable location in which people may move to and from seating areas in a location.

Figure 4:
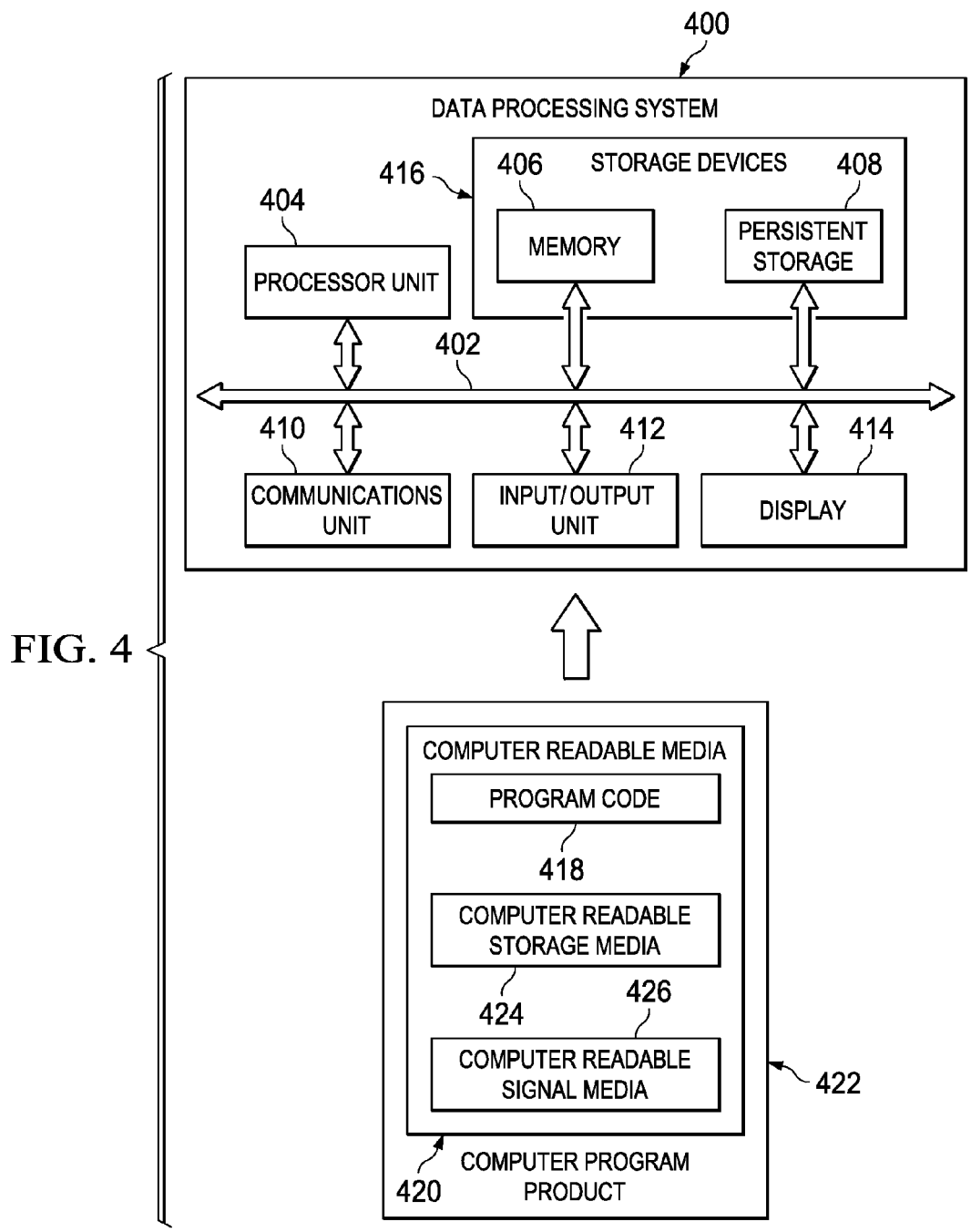
FIG. 4 is an illustration of a data processing system in accordance with an advantageous embodiment.

Turning now to FIG. 4, an illustration of a data processing system is depicted in accordance with an advantageous embodiment. In this illustrative example, data processing system 400 includes communications fabric 402, which provides communications between processor unit 404, memory 406, persistent storage 408, communications unit 410, input/output (I/O) unit 412, and display 414.

Processor unit 404 serves to execute instructions for software that may be loaded into memory 406. Processor unit 404 may be a set of one or more processors or may be a multi-processor core, depending on the particular implementation. Further, processor unit 404 may be implemented using one or more heterogeneous processor systems in which a main processor is present with secondary processors on a single chip. As another illustrative example, processor unit 404 may be a symmetric multi-processor system containing multiple processors of the same type.

Memory 406 and persistent storage 408 are examples of storage devices 416. A storage device is any piece of hardware that is capable of storing information, such as, for example, without limitation, data, program code in functional form, and/or other suitable information either on a temporary basis and/or a permanent basis. Memory 406, in these examples, may be, for example, a random access memory or any other suitable volatile or non-volatile storage device.

Persistent storage 408 may take various forms, depending on the particular implementation. For example, persistent storage 408 may contain one or more components or devices. For example, persistent storage 408 may be a hard drive, a flash memory, a rewritable optical disk, a rewritable magnetic tape, or some combination of the above. The media used by persistent storage 408 may be removable. For example, a removable hard drive may be used for persistent storage 408.

Communications unit 410, in these examples, provides for communication with other data processing systems or devices. In these examples, communications unit 410 is a network interface card. Communications unit 410 may provide communications through the use of either or both physical and wireless communications links.

Input/output unit 412 allows for the input and output of data with other devices that may be connected to data processing system 400. For example, input/output unit 412 may provide a connection for user input through a keyboard, a mouse, and/or some other suitable input device. Further, input/output unit 412 may send output to a printer. Display 414 provides a mechanism to display information to a user.

Instructions for the operating system, applications, and/or programs may be located in storage devices 416, which are in communication with processor unit 404 through communications fabric 402. In these illustrative examples, the instructions are in a functional form on persistent storage 408. These instructions may be loaded into memory 406 for execution by processor unit 404. The processes of the different embodiments may be performed by processor unit 404 using computer implemented instructions, which may be located in a memory, such as memory 406.

These instructions are referred to as program code, computer usable program code, or computer readable program code that may be read and executed by a processor in processor unit 404. The program code, in the different embodiments, may be embodied on different physical or computer readable storage media, such as memory 406 or persistent storage 408.

Program code 418 is located in a functional form on computer readable media 420 that is selectively removable and may be loaded onto or transferred to data processing system 400 for execution by processor unit 404. Program code 418 and computer readable media 420 form computer program product 422. In one example, computer readable media 420 may be computer readable storage media 424 or computer readable signal media 426. Computer readable storage media 424 may include, for example, an optical or magnetic disk that is inserted or placed into a drive or other device that is part of persistent storage 408 for transfer onto a storage device, such as a hard drive, that is part of persistent storage 408. Computer readable storage media 424 also may take the form of a persistent storage, such as a hard drive, a thumb drive, or a flash memory, that is connected to data processing system 400. In some instances, computer readable storage media 424 may not be removable from data processing system 400.

Alternatively, program code 418 may be transferred to data processing system 400 using computer readable signal media 426. Computer readable signal media 426 may be, for example, a propagated data signal containing program code 418. For example, computer readable signal media 426 may be an electromagnetic signal, an optical signal, and/or any other suitable type of signal. These signals may be transmitted over communications links, such as wireless communications links, an optical fiber cable, a coaxial cable, a wire, and/or any other suitable type of communications link. In other words, the communications link and/or the connection may be physical or wireless in the illustrative examples.

In some advantageous embodiments, program code 418 may be downloaded over a network to persistent storage 408 from another device or data processing system through computer readable signal media 426 for use within data processing system 400. For instance, program code stored in a computer readable storage media in a server data processing system may be downloaded over a network from the server to data processing system 400. The data processing system providing program code 418 may be a server computer, a client computer, or some other device capable of storing and transmitting program code 418.

The different components illustrated for data processing system 400 are not meant to provide architectural limitations to the manner in which different embodiments may be implemented. The different advantageous embodiments may be implemented in a data processing system including components in addition to or in place of those illustrated for data processing system 400.

Other components shown in FIG. 4 can be varied from the illustrative examples shown. The different embodiments may be implemented using any hardware device or system capable of executing program code. As one example, data processing system 400 may include organic components integrated with inorganic components and/or may be comprised entirely of organic components excluding a human being. For example, a storage device may be comprised of an organic semiconductor.

As another example, a storage device in data processing system 400 is any hardware apparatus that may store data. Memory 406, persistent storage 408, and computer readable media 420 are examples of storage devices in a tangible form.

In another example, a bus system may be used to implement communications fabric 402 and may be comprised of one or more buses, such as a system bus or an input/output bus. Of course, the bus system may be implemented using any suitable type of architecture that provides for a transfer of data between different components or devices attached to the bus system. Additionally, a communications unit may include one or more devices used to transmit and receive data, such as a modem or a network adapter. Further, a memory may be, for example, memory 406 or a cache such as found in an interface and memory controller hub that may be present in communications fabric 402.

Figure 5:
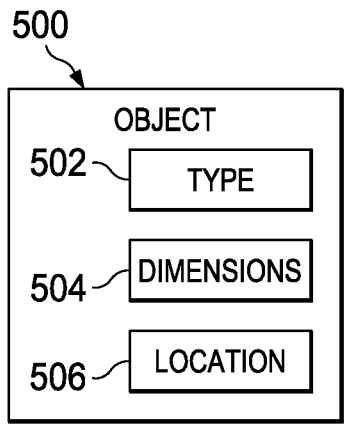
FIG. 5 is an illustration of an object for a feature in accordance with an advantageous embodiment.

With reference now to FIG. 5, an illustration of an object for a feature is depicted in accordance with an advantageous embodiment. In this illustrative example, object 500 is an example of one implementation for an object within first plurality of objects 324 in FIG. 3. Object 500 is created in these illustrative examples by object creation process 306 using number of three-dimensional models 312.

As illustrated, object 500 includes type 502, dimensions 504, and location 506. Type 502 identifies object 500. For example, type 502 may be a seat, a bin, a lavatory, a closet, an aisle, a structure, a door, or some other suitable type of object. Dimensions 504 identify the dimensions of object 500 in three-dimensional space. Location 506 identifies the location of object 500 in three-dimensional space relative to other objects that may be present in the objects identified from the features in the three-dimensional model.

Figure 6:
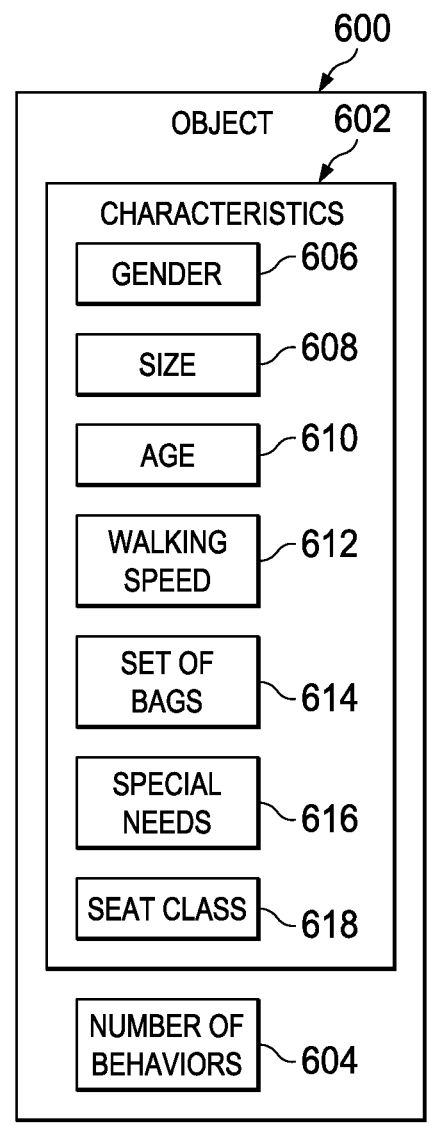
FIG. 6 is an illustration of an object for a passenger in accordance with an advantageous embodiment.

With reference now to FIG. 6, an illustration of an object for a passenger is depicted in accordance with an advantageous embodiment. In this illustrative example, object 600 is an example of one implementation for an object within second plurality of objects 325 in FIG. 3. As depicted, object 600 includes characteristics 602 and number of behaviors 604. Number of characteristics 602 may include, for example, without limitation, gender 606, size 608, age 610, walking speed 612, set of bags 614, special needs 616, and seat class 618. Gender 606 is the gender of the passenger represented by object 600. Size 608 is the size of the passenger with respect to height, weight, and/or some other suitable size factor. Age 610 is the age of the passenger. Walking speed 612 is the walking speed that the passenger may use when no obstacles are present.

Set of bags 614 includes zero or more bags for the passenger. Special needs 616 indicates whether the passenger has physical needs, such as a wheelchair, or some other physical need that may affect the amount of time needed to enplane or deplane. Special needs 616 also may include cultural needs of a passenger. Seat class 618 is the section class for the seat for the passenger. For example, seat class 618 may be economy class, business class, first class, or some other section class.

Number of behaviors 604 is assigned based on characteristics 602. Number of behaviors 604 may be the number of behaviors a passenger may exhibit when encountering an obstacle. For example, number of behaviors 604 may include, without limitation, moving to another aisle, moving past a stopped passenger, waiting a selected distance between a stopped passenger, moving backwards in an aisle when space is not found for one of set of bags 614, and/or some other suitable type of behavior.

Figure 7:
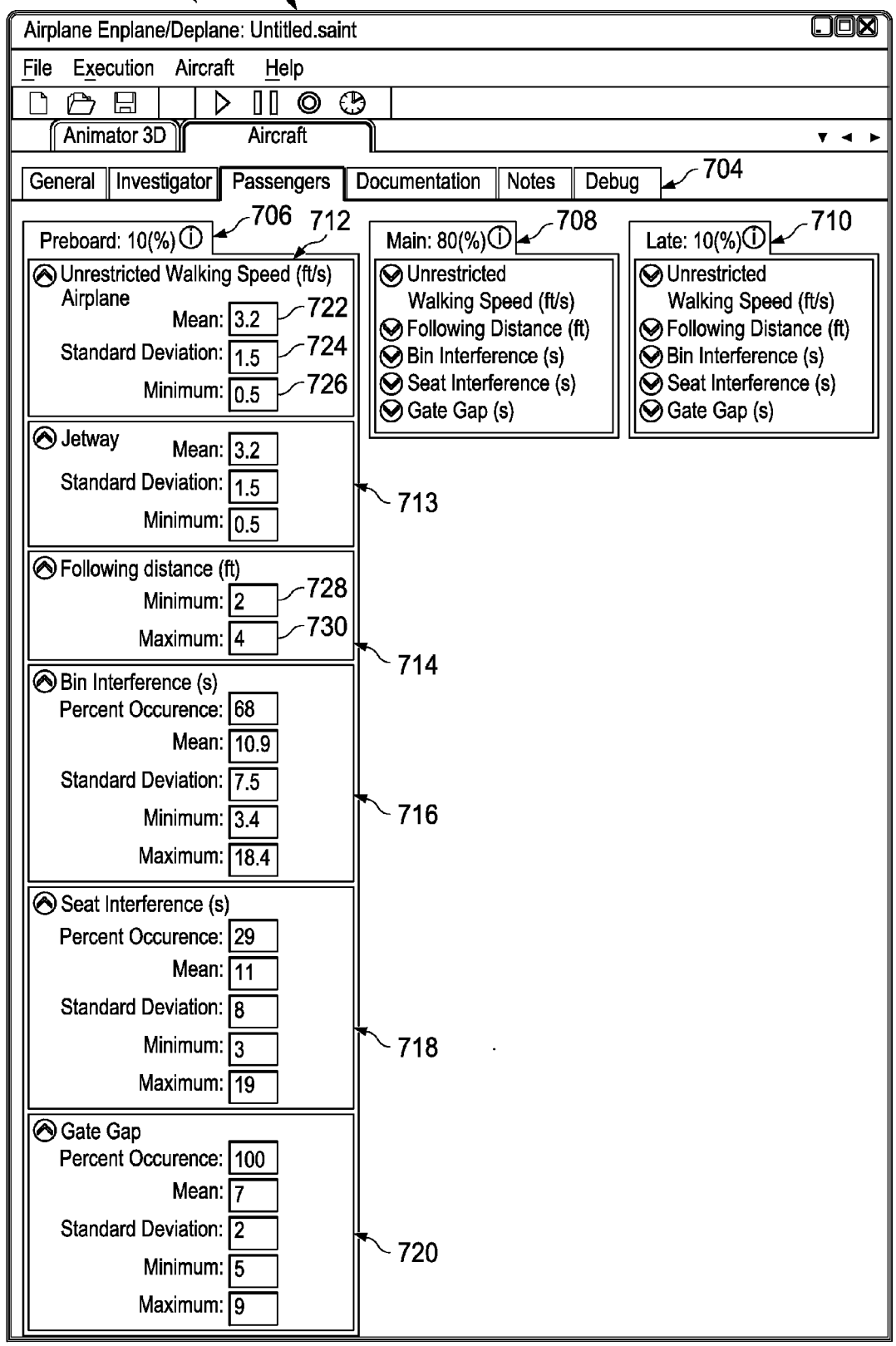
FIG. 7 is an illustration of a user interface in accordance with an advantageous embodiment.

With reference now to FIG. 7, an illustration of a user interface is depicted in accordance with an advantageous embodiment. In this illustrative example, user interface 700 is an example of one implementation for user interface 310 in FIG. 3. In particular, user interface 700 takes the form of graphical user interface 702.

In this illustrative example, graphical user interface 702 presents display 704. Display 704 is configured to receive user input from a user. This user input may identify a number of characteristics for passengers for a simulation of passenger flow. Display 704 includes preboarding section 706, main boarding section 708, and late boarding section 710.

As depicted in this example, user input in preboarding section 706 identifies that about 10 percent of the passengers for the simulation will be in a preboarding group. User input for main boarding section 708 identifies that about 80 percent of the passengers will be in a main boarding group. User input for late boarding section 710 identifies that about 10 percent of the passengers will be in a late boarding group.

In this depicted example, preboarding section 706, main boarding section 708, and late boarding section 710 include subsections for characteristics and behaviors for the passengers. For example, in preboarding section 706, these subsections include airplane walking speed 712, walkway walking speed 713, following distance 714, bin interference 716, seat interference 718, and gate gap 720. Each of these subsections, in turn, includes a number of values that may be specified by the user.

Airplane walking speed 712 identifies the walking speed for the passengers walking in the aircraft. Walkway walking speed 713 identifies the walking speed for passengers walking on the walkway from a gate terminal to the aircraft. Following distance 714 identifies how closely a passenger may follow another passenger. Bin interference 716 identifies the time a passenger may spend at a bin in response to an obstacle at the bin. This obstacle may be, for example, without limitation, luggage not fitting in a bin, luggage needing to be reorganized in a bin, and/or some other suitable type of obstacle.

Seat interference 718 identifies the time a passenger may spend reaching the seat for the passenger in response to an obstacle. This obstacle may be, for example, without limitation, another passenger needing to move out of the way, not finding the correct seat, and/or some other suitable type of obstacle.

Gate gap 720 identifies the delay in time for passengers moving from a passenger waiting area to the walkway between the gate and the passenger cabin. This delay in time may be due to, for example, without limitation, delays in the processing of passenger boarding tickets, delays between boarding calls for different boarding groups, delays due to passengers arriving late, and/or other suitable types of delays.

As one specific example, user input for airplane walking speed 712 specifies a number of values for the walking speed for the passengers. For example, user input identifies mean 722, standard deviation 724, and minimum 726 for airplane walking speed 712. As depicted in this example, mean 722 is about 3.2 feet per second, standard deviation 724 is about 1.5 feet per second, and minimum 726 is about 0.5 feet per second. In this manner, a simulation process, such as simulation process 308 in FIG. 3, may select a walking speed for a particular passenger in the simulation according to the defined mathematical distribution as is well known in the art of simulation.

As yet another example, user input for following distance 714 specifies that a passenger in the preboarding group may follow behind another passenger at a distance between minimum 728 and maximum 730. Minimum 728 is about 2 feet, and maximum 730 is about 4 feet. Of course, in other advantageous embodiments, user input may identify other characteristics and/or values using graphical user interface 702.

Figure 8:
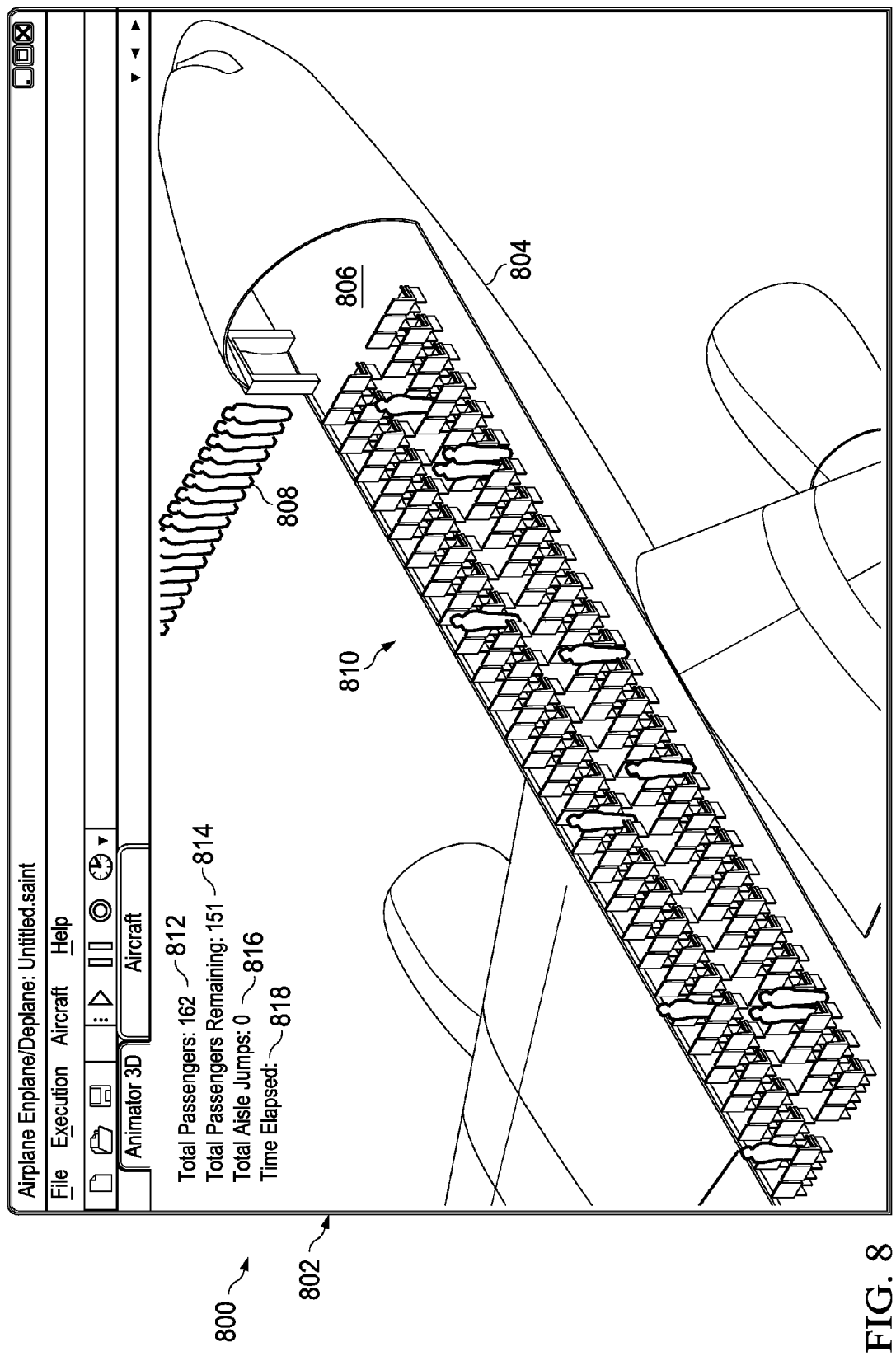
FIG. 8 is an illustration of a user interface in accordance with an advantageous embodiment.

With reference now to FIG. 8, an illustration of a user interface is depicted in accordance with an advantageous embodiment. In this illustrative example, user interface 800 is an example of an implementation for user interface 310 in FIG. 3. In particular, user interface 800 takes the form of graphical user interface 802.

In this illustrative example, an exposed view of aircraft 804 is depicted. In this view, cabin 806 is presented on user interface 800. Additionally, passengers 808 also are illustrated as enplaning to seats 810 in cabin 806. In this illustrative example, user interface 800 may be used to illustrate the movement of passengers 808. For example, user interface 800 may be a video illustrating the movement of passengers to seats 810. Additionally, user interface 800 also may provide information, such as total number of passengers 812, passengers remaining to be seated 814, and aisle jumps 816. Of course, other types of information in addition to or in place of this information may be presented. For example, time elapsed 818 also may be presented.

Figure 9:
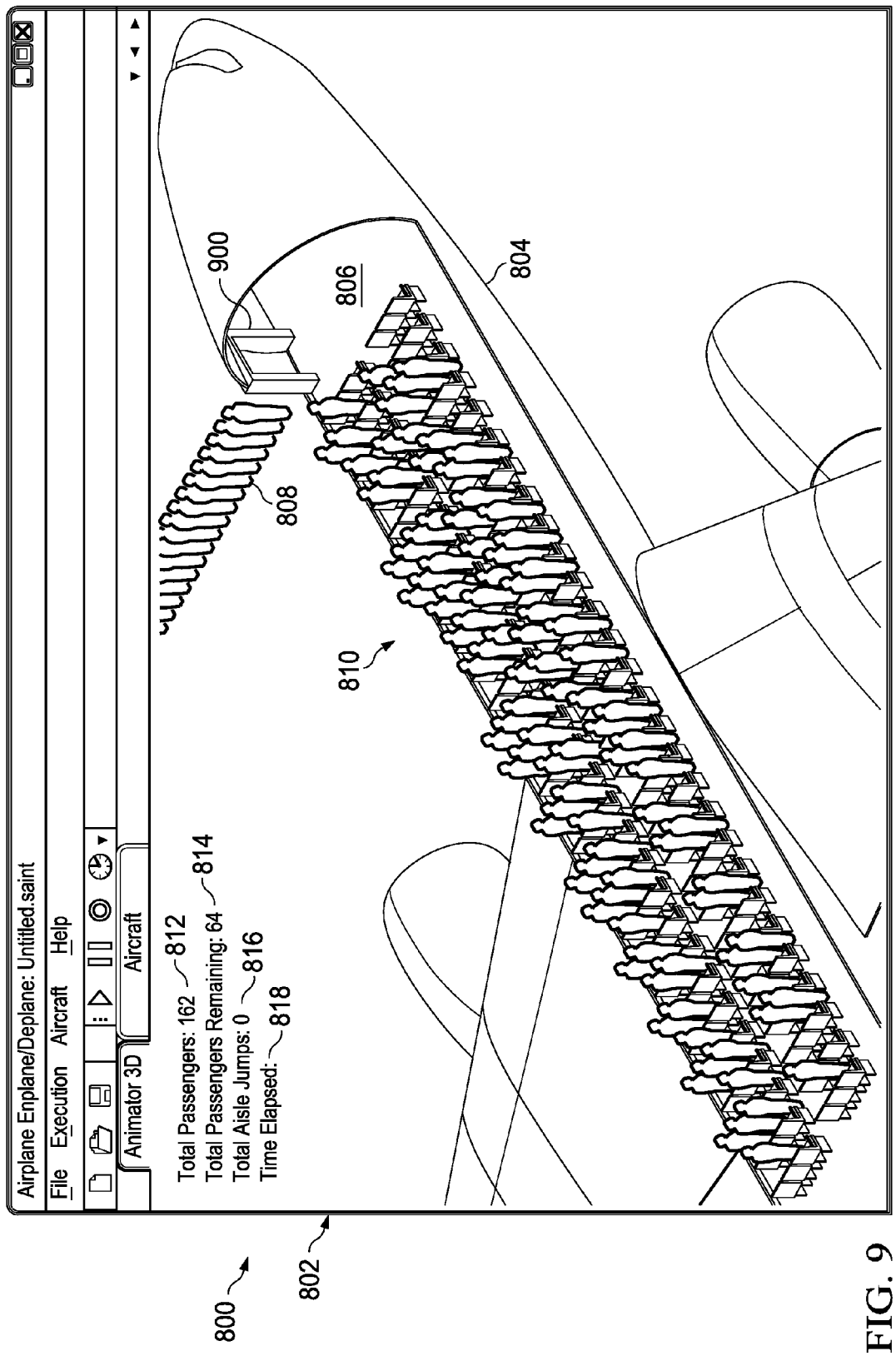
FIG. 9 is an illustration of a user interface in accordance with an advantageous embodiment.

With reference now to FIG. 9, an illustration of user interface 800 is depicted in accordance with an advantageous embodiment. In this illustrative example, user interface 800 is depicted at a later point in time in the enplaning of passengers 808 as compared to user interface 800 in FIG. 8. As depicted in this example, more of passengers 808 have moved to their seats in seats 810.

In other illustrative embodiments, user interface 800 may present a movement of passengers to locations in addition to or in place of seats 810. For example, user interface 800 may present a deplaning of passengers 808 from seats 810 to exit 900 of cabin 806.

Figure 10:
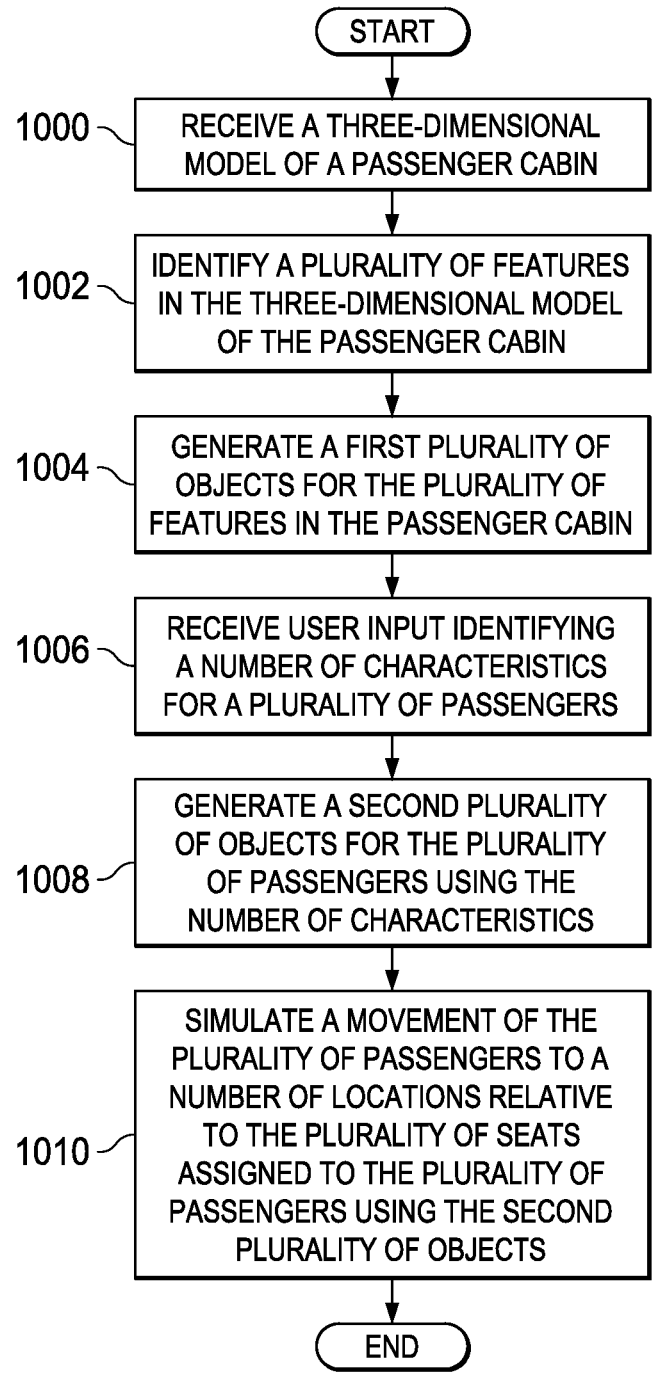
FIG. 10 is an illustration of a flowchart of a process for analyzing passenger flow in accordance with an advantageous embodiment.

With reference now to FIG. 10, an illustration of a flowchart of a process for analyzing passenger flow is depicted in accordance with an advantageous embodiment. The process illustrated in FIG. 10 may be implemented in passenger flow analysis environment 300 in FIG. 3. Further, this process may be implemented to analyze passenger cabin 208 in FIG. 2.

The process begins by receiving a three-dimensional model of a passenger cabin (operation 1000). The three-dimensional model may be received from a model database, such as model database 314 in FIG. 3. The process then identifies a plurality of features in the three-dimensional model of the passenger cabin in response to receiving the three-dimensional model of the passenger cabin (operation 1002). The plurality of features may include, for example, a seat, a bin, a closet, a lavatory, an aisle, a door, and/or other suitable features.

Thereafter, the process generates a first plurality of objects for the plurality of features in the passenger cabin (operation 1004). This first plurality of objects may take the form of first plurality of objects 324 in FIG. 3. The process then receives user input identifying a number of characteristics for a plurality of passengers (operation 1006). For example, user input may be used to identify a number of characteristics 602 in FIG. 6. Thereafter, the process generates a second plurality of objects for the plurality of passengers using the number of characteristics (operation 1008).

In these illustrative examples, the second plurality of objects is assigned to a plurality of seats within a passenger cabin. Further, each of the second plurality of objects is assigned a destination location and has a behavior when encountering an obstacle while moving from a current location to the destination location.

The process then simulates a movement of the plurality of passengers to a number of locations relative to the plurality of seats assigned to the plurality of passengers using the second plurality of objects (operation 1010), with the process terminating thereafter.

Figure 11:
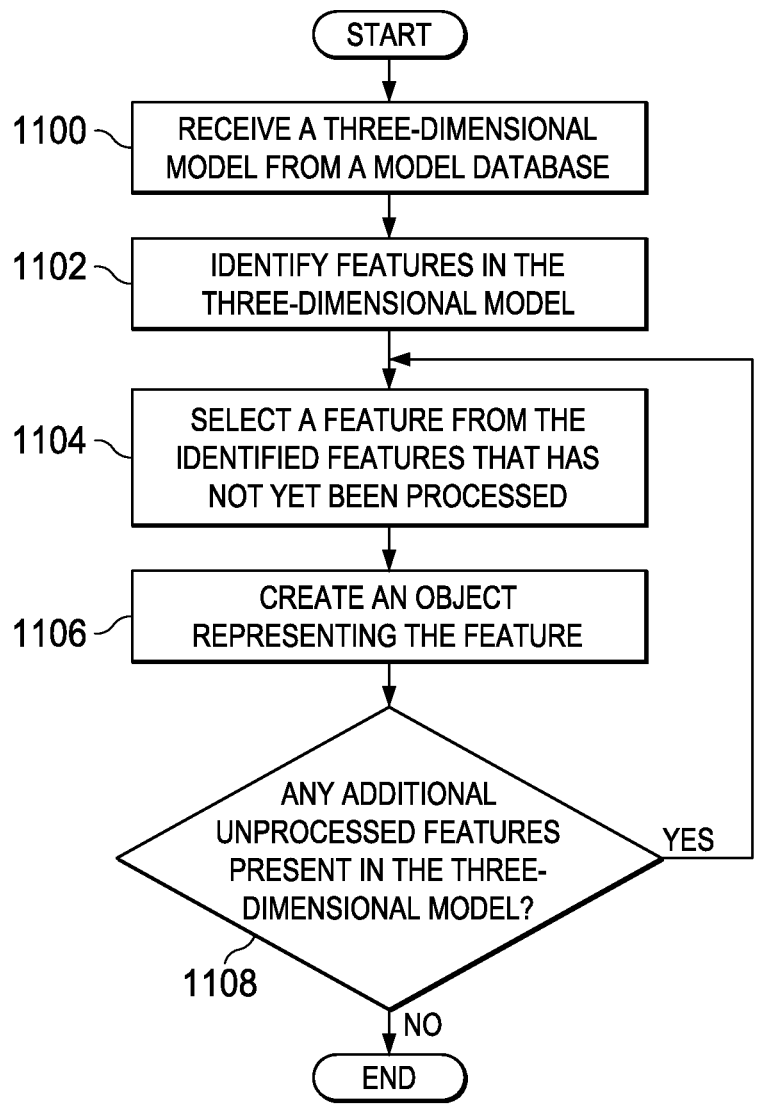
FIG. 11 is an illustration of a flowchart of a process for generating objects using an object creation process in accordance with an advantageous embodiment.

With reference now to FIG. 11, an illustration of a flowchart of a process for generating objects using an object creation process is depicted in accordance with an advantageous embodiment. The process illustrated in FIG. 11 may be implemented using object creation process 306 in FIG. 3. For example, this process may be implemented to create object 500 in FIG. 5.

The process begins by receiving a three-dimensional model from a model database (operation 1100). This three-dimensional model may include at least one of a passenger cabin, a walkway, and a passenger waiting area. The process then identifies features in the three-dimensional model (operation 1102). These features may include seats, bins, closets, lavatories, doors, aisles, structures, and/or other suitable types of features.

The process selects a feature from the identified features that has not yet been processed (operation 1104). The process then uses the selected feature to create an object representing the feature (operation 1106). This object may be used by a simulation process, such as simulation process 308 in FIG. 3.

The process then determines whether any additional unprocessed features are present in the three-dimensional model (operation 1108). If additional unprocessed features are not present, the process terminates. Otherwise, the process returns to operation 1104 as described above. In this manner, objects may be generated to represent all of the features identified in the three-dimensional model.

Figure 12:
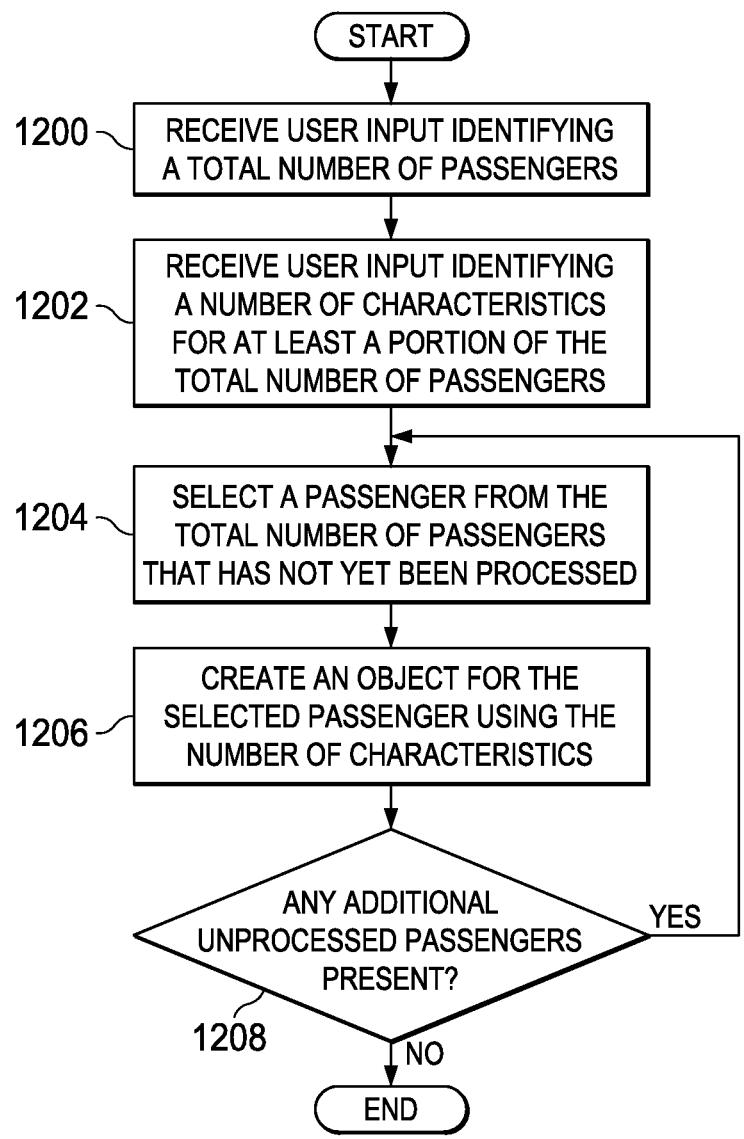
FIG. 12 is an illustration of a flowchart of a process for generating objects using an object creation process in accordance with an advantageous embodiment.

With reference now to FIG. 12, an illustration of a flowchart of a process for generating objects using an object creation process is depicted in accordance with an advantageous embodiment. The process illustrated in FIG. 12 may be implemented using object creation process 306 in FIG. 3. Further, this process may be implemented to create objects representing passengers, such as object 600 in FIG. 6.

The process begins by receiving user input identifying a total number of passengers (operation 1200). The process then receives user input identifying a number of characteristics for at least a portion of the total number of passengers (operation 1202). This user input may be received through a graphical user interface, such as graphical user interface 702 in FIG. 7.

Thereafter, the process selects a passenger from the total number of passengers that has not yet been processed (operation 1204). The process creates an object for the selected passenger using the number of characteristics (operation 1206).

The process then determines whether any additional unprocessed passengers are present (operation 1208). If additional unprocessed passengers are not present, the process terminates. Otherwise, the process returns to operation 1204. In this manner, objects for the total number of passengers are created.

Figure 13:
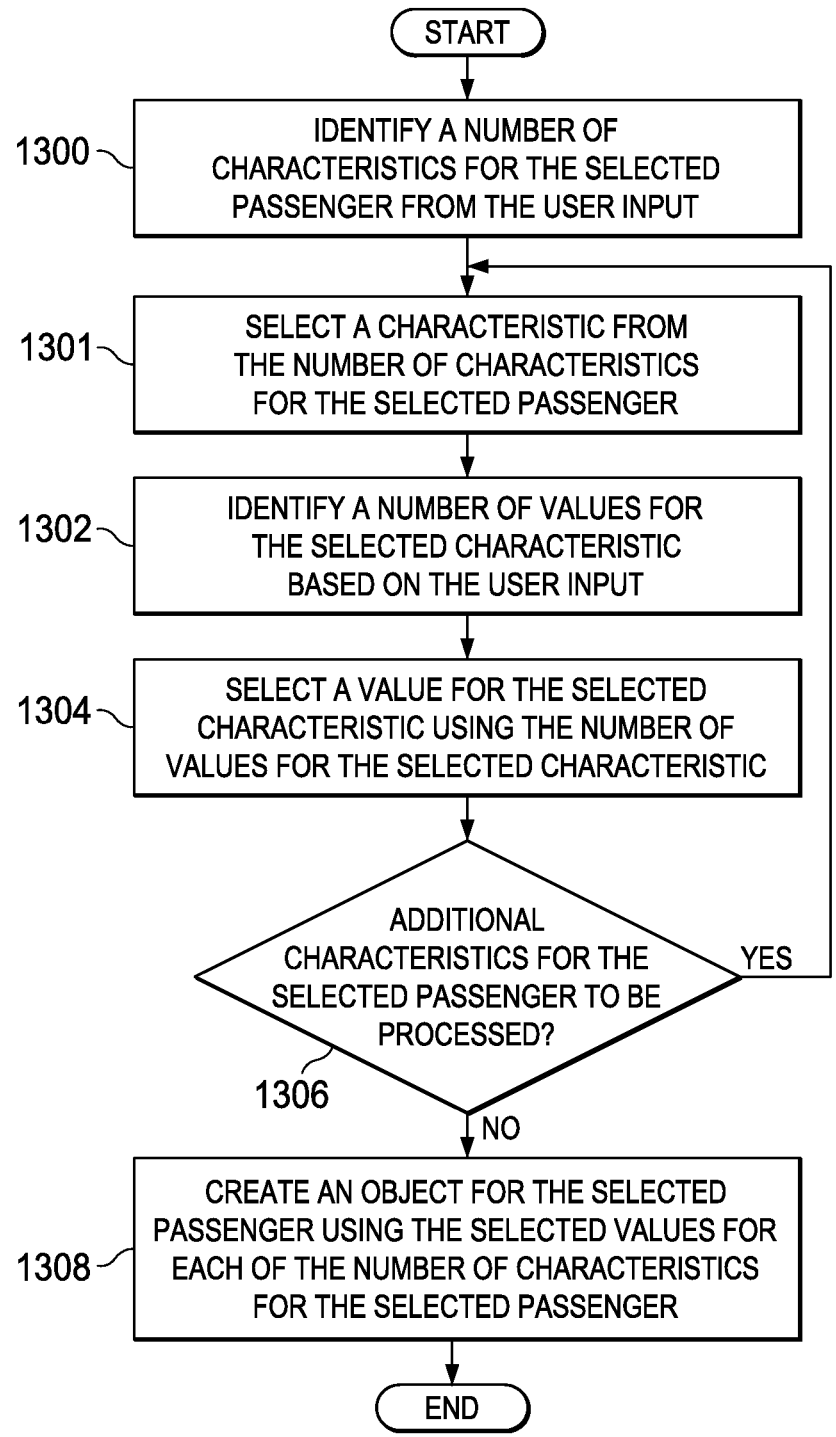
FIG. 13 is an illustration of a flowchart of a process for generating a plurality of objects in accordance with an advantageous embodiment.

With reference now to FIG. 13, an illustration of a flowchart of a process for generating a plurality of objects is depicted in accordance with an advantageous embodiment. The process illustrated in FIG. 13 may be implemented using object creation process 306 in FIG. 3. This process is an example of one implementation for operation 1206 in FIG. 12.

The process begins by identifying a number of characteristics for the selected passenger from the user input (operation 1300). The process then selects a characteristic from the number of characteristics for the selected passenger (operation 1301).

Thereafter, the process identifies a number of values based on the user input for the selected characteristic (operation 1302). In other advantageous embodiments, the number of values may be identified based on a number of values in a file, a prior selection of values, actual passenger flow data, and/or other factors in addition to or in place of the user input. The number of values may comprise at least one of, for example, without limitation, a single value, a mean and standard deviation, a minimum, a maximum, a range of values, a list of values, and/or some other suitable types of values.

The process then selects a value for the selected characteristic using the number of values for the selected characteristic (operation 1304). As one example, in operation 1304, the process may randomly select a value according to the defined mathematical distribution as is well known in the art of simulation. In another example, the process may randomly select the value from a list of values.

The process then determines whether additional characteristics for the selected passenger are present to be processed (operation 1306). If additional characteristics are present, the process returns to operation 1301 as described above. Otherwise, the process creates an object for the selected passenger using the selected values for each of the number of characteristics for the selected passenger (operation 1308), with the process terminating thereafter.

Figure 14:
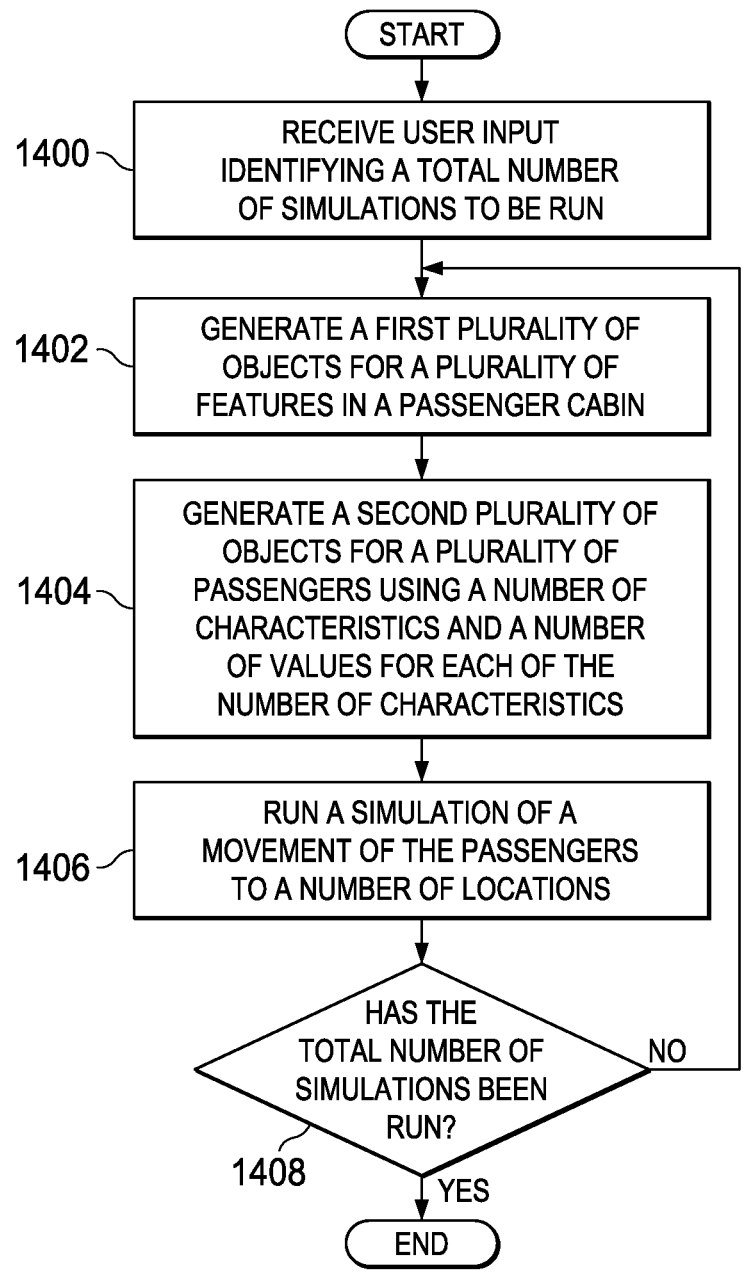
FIG. 14 is an illustration of a flowchart of a process for running a plurality of simulations for passenger flow in accordance with an advantageous embodiment.

With reference now to FIG. 14, an illustration of a flowchart of a process for running a plurality of simulations for passenger flow is depicted in accordance with an advantageous embodiment. The process illustrated in FIG. 14 may be implemented using object creation process 306 and simulation process 308 in FIG. 3.

The process begins by receiving user input identifying a total number of simulations to be run (operation 1400). The process then generates a first plurality of objects for a plurality of features in a passenger cabin (operation 1402). In operation 1402, the first plurality of objects may be generated using the process described in FIG. 11.

The process generates a second plurality of objects for a plurality of passengers using a number of characteristics and a number of values for each of the number of characteristics (operation 1404). In operation 1404, the second plurality of objects may be generated using the process illustrated in FIG. 12. In particular, each of the second plurality of objects may be generated using the process illustrated in FIG. 13.

Thereafter, the process runs a simulation of a movement of the passengers to a number of locations (operation 1406). The number of locations may include, for example, without limitation, a door, an exit, a seat, a lavatory, or some other suitable location. The process then determines whether the total number of simulations has been run (operation 1408). If the total number of simulations has not been run, the process then returns to operation 1402. Otherwise, the process terminates.

The flowcharts and block diagrams in the different depicted embodiments illustrate the architecture, functionality, and operation of some possible implementations of apparatus and methods in different advantageous embodiments. In this regard, each block in the flowcharts or block diagrams may represent a module, segment, function, and/or a portion of an operation or step. In some alternative implementations, the function or functions noted in the block may occur out of the order noted in the figures. For example, in some cases, two blocks shown in succession may be executed substantially concurrently, or the blocks may sometimes be executed in the reverse order.

Thus, the different advantageous embodiments provide a method and apparatus for simulating passenger flow. In one or more advantageous embodiments, a passenger flow system is provided to identify the movement of a plurality of passengers and the time needed for that movement. A three-dimensional model of a passenger cabin is received. A plurality of features in the three-dimensional model of a passenger cabin is identified in response to receiving the three-dimensional model.

The process then generates a first plurality of objects for the plurality of features identified in the passenger cabin. User input is also received identifying a number of characteristics for the plurality of passengers. A second plurality of objects is generated for the plurality of passengers using the number of characteristics. The second plurality of objects is assigned to a plurality of seats within the passenger cabin. Each of the second plurality of objects is assigned a destination location and has a behavior when encountering an obstacle while moving from a current location to a destination location. The movement of the plurality of passengers is simulated. This movement is to a number of locations relative to the plurality of seats assigned to the plurality of passengers. This movement of the plurality of passengers is simulated using the second plurality of objects in these illustrative examples.

The passenger flow system described in the different advantageous embodiments serves as a tool for analyzing passenger flow. This tool may be used by different types of users. For example, researchers may use this tool to determine which passenger characteristics and/or behaviors lead to delays in enplaning and/or deplaning. As another example, engineers may use the passenger flow system to help in the design of passenger cabins for new aircraft.

The different advantageous embodiments also provide a tool that allows a plurality of simulations to be run based on values for characteristics for passengers identified from actual passenger flow data. In this manner, the different advantageous embodiments provide a tool for simulating passenger flow using real-world data.

The different advantageous embodiments can take the form of an entirely hardware embodiment, an entirely software embodiment, or an embodiment containing both hardware and software elements. Some embodiments are implemented in software, which includes but is not limited to, forms, such as, for example, firmware, resident software, and microcode.

Furthermore, the different embodiments can take the form of a computer program product accessible from a computer usable or computer readable medium providing program code for use by or in connection with a computer or any device or system that executes instructions. For the purposes of this disclosure, a computer usable or computer readable medium can generally be any tangible apparatus that can contain, store, communicate, propagate, or transport the program for use by or in connection with the instruction execution system, apparatus, or device.

The computer usable or computer readable medium can be, for example, without limitation, an electronic, magnetic, optical, electromagnetic, infrared, or semiconductor system, or a propagation medium. Non-limiting examples of a computer readable medium include a semiconductor or solid state memory, magnetic tape, a removable computer diskette, a random access memory (RAM), a read-only memory (ROM), a rigid magnetic disk, and an optical disk. Optical disks may include compact disk-read only memory (CD-ROM), compact disk-read/write (CD-R/W), and DVD.

Further, a computer usable or computer readable medium may contain or store a computer readable or usable program code such that when the computer readable or usable program code is executed on a computer, the execution of this computer readable or usable program code causes the computer to transmit another computer readable or usable program code over a communications link. This communications link may use a medium that is, for example, without limitation, physical or wireless.

A data processing system suitable for storing and/or executing computer readable or computer usable program code will include one or more processors coupled directly or indirectly to memory elements through a communications fabric, such as a system bus. The memory elements may include local memory employed during actual execution of the program code, bulk storage, and cache memories, which provide temporary storage of at least some computer readable or computer usable program code to reduce the number of times code may be retrieved from bulk storage during execution of the code.

Input/output or I/O devices can be coupled to the system either directly or through intervening I/O controllers. These devices may include, for example, without limitation, keyboards, touch screen displays, and pointing devices. Different communications adapters may also be coupled to the system to enable the data processing system to become coupled to other data processing systems, remote printers, or storage devices through intervening private or public networks. Non-limiting examples are modems and network adapters and are just a few of the currently available types of communications adapters.

The description of the different advantageous embodiments has been presented for purposes of illustration and description, and it is not intended to be exhaustive or limited to the embodiments in the form disclosed. Many modifications and variations will be apparent to those of ordinary skill in the art. Further, different advantageous embodiments may provide different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method for analyzing passenger flow, the method comprising;
   receiving a three-dimensional model of a passenger cabin;
   identifying a plurality of three-dimensional features in the three-dimensional model of the passenger cabin in response to receiving the three-dimensional model of the passenger cabin;
   generating a first plurality of three-dimensional objects for the plurality of three-dimensional features in the passenger cabin using the three-dimensional model of the passenger cabin;
   receiving user input identifying a number of characteristics for a plurality of passengers;
   generating a second plurality of three-dimensional objects for the plurality of passengers using the number of characteristics, wherein the second plurality of three-dimensional objects is assigned to a plurality of seats within the passenger cabin, wherein each of the second plurality of three-dimensional objects is assigned a destination location and has a behavior when encountering an obstacle while moving from a current location to the destination location;
   simulating a movement of the plurality of passengers to a number of locations relative to the plurality of seats assigned to the plurality of passengers using the first plurality of three-dimensional objects and the second plurality of three-dimensional objects; and
   generating and displaying a video illustrating the movement of the plurality of passengers moving to the number of locations in a three-dimensional representation of the passenger cabin.

2. The method of claim 1, wherein the step of receiving the user input identifying the number of characteristics for the plurality of passengers comprises:
   receiving the user input identifying the number of characteristics for the plurality of passengers through a graphical user interface.

3. The method of claim 1 further comprising:
   identifying a time needed to move the plurality of passengers to the number of locations.

4. The method of claim 1, wherein the number of locations is selected from one of a number of exits for the passenger cabin, a passenger area, a location in a walkway to the passenger cabin, and the plurality of seats assigned to a plurality of objects.

5. The method of claim 3 further comprising:
   changing the three-dimensional model of the passenger cabin to reduce the time needed to move the plurality of passengers to the number of locations.

6. The method of claim 3 further comprising:
   changing at least one of a deplaning and an enplaning process to reduce the time needed to move the plurality of passengers to the number of locations.

7. The method of claim 1, wherein the step of simulating the movement of the plurality of passengers to the number of locations relative to the plurality of seats assigned to the plurality of passengers using the second plurality of objects comprises:
   simulating the movement of the plurality of passengers to the number of locations relative to the plurality of seats assigned to the plurality of passengers using the second plurality of objects for a plurality of times; and
   applying a deviation to the behavior for the each of the second plurality of objects to reduce each of the plurality of times.

8. The method of claim 1, wherein the plurality of features comprises at least one of a seat, an overhead bin, an aisle, a door, a monument, a closet, a walkway, and a lavatory.

9. The method of claim 1, wherein the three-dimensional model of the passenger cabin is a first three-dimensional model and further comprises a second three-dimensional model of at least one of a walkway to the passenger cabin and a passenger waiting area and further comprising:
   identifying a number of features in the second three-dimensional model in response to receiving the three-dimensional model of the passenger cabin; and
   generating a third plurality of objects for the number of features.

10. The method of claim 9, wherein the simulating step includes:
    moving the second plurality of objects through the at least one of the walkway to the passenger cabin and the passenger waiting area.

11. The method of claim 1, wherein the user input identifies a number of values for each of the number of characteristics.

12. The method of claim 11, wherein the number of values comprises at least one of a single value, a mean and standard deviation, a minimum, a maximum, a range of values, and a list of values.

13. An apparatus comprising:
    a bus system;
    a memory connected to the bus system; and
    a processor unit connected to the bus system and configured to run a program to receive a three-dimensional model of a passenger cabin to identify a plurality of three-dimensional features in the three-dimensional model of the passenger cabin in response to receiving the three-dimensional model of the passenger cabin; generate a first plurality of three-dimensional objects for the plurality of three-dimensional features in the passenger cabin using the three-dimensional model of the passenger cabin; receive user input identifying a number of characteristics for a plurality of passengers; generate a second plurality of three-dimensional objects for the plurality of passengers using the number of characteristics, wherein the second plurality of three-dimensional objects is assigned to a plurality of seats within the passenger cabin, wherein each of the second plurality of three-dimensional objects is assigned a destination location and has a behavior when encountering an obstacle while moving from a current location to the destination location; simulate a movement of the plurality of passengers to a number of locations relative to the plurality of seats assigned to the plurality of passengers using the first plurality of three-dimensional objects and the second plurality of three-dimensional objects; and generate and display a video illustration of the movement of the plurality of passengers moving to the number of locations in a three-dimensional representation of the passenger cabin.

14. The apparatus of claim 13, wherein in receiving the user input identifying the number of characteristics for the plurality of passengers, the processor unit is further configured to run the program to receive the user input identifying the number of characteristics for the plurality of passengers through a graphical user interface.

15. The apparatus of claim 13, wherein the processor unit is further configured to run the program to identify a time needed to move the plurality of passengers to the number of locations.

16. The apparatus of claim 13, wherein the number of locations is selected from one of a number of exits for the cabin, a passenger area, a location in a walkway to the passenger cabin, and the plurality of seats assigned to a plurality of objects.

17. The apparatus of claim 15, wherein the processor unit is further configured to run the program to change the three-dimensional model of the passenger cabin to reduce the time needed to move the plurality of passengers to the number of locations.

18. The apparatus of claim 15, wherein the processor unit is further configured to run the program to change at least one of a deplaning and an enplaning process to reduce the time needed to move the plurality of passengers to the number of locations.

19. The apparatus of claim 13, wherein in simulating the movement of the plurality of passengers to the number of locations relative to the plurality of seats assigned to the plurality of passengers using the second plurality of objects, the processor unit is further configured to run the program to simulate the movement of the plurality of passengers to the number of locations relative to the plurality of seats assigned to the plurality of passengers using the second plurality of objects for a plurality of times; and apply a deviation to the behavior for the each of the second plurality of objects to reduce each of the plurality of times.

20. The apparatus of claim 13, wherein the plurality of features comprises at least one of a seat, an overhead bin, an aisle, a door, a monument, a closet, a walkway, and a lavatory.

21. The apparatus of claim 13, wherein the three-dimensional model of the passenger cabin is a first three-dimensional model and further comprises a second three-dimensional model of at least one of a walkway to the passenger cabin and a passenger waiting area and wherein the processor unit is further configured to run the program to identify a number of features in the second three-dimensional model in response to receiving the three-dimensional model of the passenger cabin; and generate a third plurality of objects for the number of features.

22. The apparatus of claim 21, wherein in simulating the movement of the plurality of passengers to the number of locations relative to the plurality of seats assigned to the plurality of passengers using the second plurality of objects, the processor unit is further configured to run the program to move the second plurality of objects through the at least one of the walkway to the passenger cabin and the passenger waiting area.

23. The apparatus of claim 13, wherein the user input identifies a number of values for each of the number of characteristics.

24. The apparatus of claim 23, wherein the number of values comprises at least one of a single value, a mean and standard deviation, a minimum, a maximum, a range of values, and a list of values.

* * * * *